(12) United States Patent
Gao (10) Patent No.: US 11,980,008 B2
(45) Date of Patent: May 7, 2024

(54) HIGH DENSITY SERVER CHASSIS PACKAGING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 209 days.

(21) Appl. No.: 17/700,144

(22) Filed: Mar. 21, 2022

(65) Prior Publication Data
US 2023/0301021 A1    Sep. 21, 2023

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 7,965,509 B2 * | 6/2011 | Campbell | H01L 23/473 361/720 |
| 9,132,519 B2 * | 9/2015 | Chainer | H05K 7/20827 |
| 9,496,200 B2 * | 11/2016 | Lyon | H05K 7/20781 |
| 9,848,514 B2 * | 12/2017 | Shelnutt | G06F 1/20 |
| 10,342,164 B2 * | 7/2019 | So | H05K 7/20772 |
| 10,582,645 B1 * | 3/2020 | Kufahl | H05K 7/20772 |
| 2017/0127575 A1 * | 5/2017 | Lunsman | H05K 7/20263 |
| 2022/0071049 A1 * | 3/2022 | Heydari | H05K 7/20836 |
| 2022/0110223 A1 * | 4/2022 | Heydari | H05K 7/20509 |
| 2022/0151114 A1 * | 5/2022 | Heydari | H05K 7/20272 |

* cited by examiner

*Primary Examiner* — Courtney L Smith
(74) *Attorney, Agent, or Firm* — WOMBLE BOND DICKINSON (US) LLP (57) ABSTRACT

A server chassis can include a first pair of connectors on a rear side of the server chassis arranged to face in a rear direction to engage with connectors of a server rack. Upon engaging of the connectors, the server chassis fluidly connects to a supply line and a return line of the server rack. The server chassis includes a second pair of connectors on a front side of the server chassis, to fluidly connect to a cooling system of a server node housed within the server chassis. The second pair of connectors are held to the server chassis with one or more movable attachments that enable coupling and decoupling of the second pair of connectors to the cooling system of the server node. Fluid channels fluidly connect the first pair of connectors to the second pair of fluid connectors.

20 Claims, 7 Drawing Sheets

(SIDE VIEW)

FIG. 1A

(SIDE VIEW)

FIG. 1B

(TOP VIEW)

FIG. 2

(SIDE VIEW)
FIG. 3A

(SIDE VIEW)
FIG. 3B

(SIDE VIEW)
FIG. 4

(SIDE VIEW)
FIG. 5

(SIDE VIEW)
FIG. 6

FIG. 7

HIGH DENSITY SERVER CHASSIS PACKAGING

FIELD

Embodiments of the present disclosure relate generally to electronics cooling for servers in a server rack. In particular, a server chassis may include front and rear connectors fluid connectors to facilitate fluid management fora variety of server node arrangements.

BACKGROUND

Information Technology (IT) includes technology such as computers that are accessible through the internet or a local network, which provide storage of, or access to, data, websites, computer programs, algorithms, services, and more. IT equipment such as servers and other electronic components (e.g., peripheral devices) can be installed in a server chassis. These server chassis can then be installed in a server rack, which may also be referred to as an IT rack.

A server rack can be populated with a plurality of server chassis, each server chassis housing one or more printed circuit board where the electronics components and integrated circuits are packaged. The server chassis can serve to manage power, thermal requirements, electronic connectivity, structural support, and other considerations of the IT equipment.

Liquid cooling for high power density electronics has increased in popularity because air cooling can be thermally insufficient in some circumstances. Liquid cooling allows for higher packaging density and increased computing load of electronics, by properly transferring the heat load generated by the electronics and at the same time, providing proper thermal environment.

A server rack may include a plurality of server chassis installed upon it. Some server chassis may have high-density components—multiple servers may be populated to and coexist in a single server chassis. Other server racks may have a single server. As such, the number and/or position of connectors from one server chassis to another in a server rack may vary based on the type or number of servers that are housed by the server chassis.

A server rack may include infrastructure to circulate fluid (e.g., a liquid coolant) to and from each of the server chassis that are populated within the server rack. Thus, it is desirable to have a server chassis that can accommodate the various configurations of servers and maintain a common interface between the server chassis and the server rack.

Further, it is desirable for efficient installation, removal, and serviceability of each server chassis in the server rack, which may include fluidly connecting and/or disconnecting the server chassis from the server rack and accessing fluid connection and disconnection of servers from a front side of a server rack. Further, it is desirable fora server chassis to be expandable and modular and serviceable on a per-node basis.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the present disclosure can address issues identified, such as accommodating various configurations of a server chassis in a flexible and modular manner; providing an efficient installation, removal, and serviceability of each server chassis in the server rack. In particular, embodiments of the present disclosure support accessibility to fluid connectors on a per-node basis and enables modular arrangements of the server nodes within a server chassis.

In the present disclosure, a server chassis architecture includes fluid cooling components related to packaging, integrating, and fluidly connecting one or more server nodes in the server chassis. The server chassis architecture includes structural components (e.g., a frame), and fluid connecting and carrying components. The resulting server chassis arrangement provides a high reliable liquid cooling solution fora server chassis and server rack. Such a solution may be deployed to a variety of high power density electronics boards.

A server chassis may be understood as an assembly that includes mechanical, thermal, electrical, and electronic components that support operability of one or more server nodes housed in the server chassis. A server node may include electronic server components (e.g., one or more processing devices), a cooling system (e.g., a cold plate, a thermosiphon loop, or other fluid-based cooling system), a printed circuit board, power electronics, and other server components. The server chassis may house one or more server nodes, and a plurality of such server chassis may be populated to a server rack.

Generally, a server chassis may be inserted into a server rack from a front of the server rack. An insertion force may mate rear-facing fluid connectors of the server chassis to supply and return lines of the server rack. Fluid channels may fluidly connect those rear-facing fluid connectors of the server chassis with at least one pair of connectors that is manually operable from a front of the server chassis. In such a manner, a user may populate the server chassis to the server rack by pushing the server chassis into the server rack (e.g., with blind mating connectors). The user may then manually connect each pair of connectors at the front of the server chassis to a corresponding server node. This allows for efficient installation of the server chassis into the server rack, as well as serviceability and maintainability fluid lines of the server nodes from the front of the server chassis and the server rack.

In some aspects, a server chassis includes a first pair of connectors on a rear side of the server chassis arranged to face in a rear direction to mate with server rack connectors which fluidly connect the server chassis to a supply line and a return line of the server rack. The server chassis includes a second pair of connectors on a front side of the server chassis, to fluidly connect to a cooling system of a first server node to be housed within the server chassis. The second pair of connectors are held to the server chassis with one or more movable attachments to support manual coupling and decoupling of the second pair of connectors to the cooling system. The server chassis includes a plurality of fluid channels that fluidly connects a first of the first pair of connectors to a first of the second pair of connectors, and a second of the first pair of connectors to a second of the second pair of connectors.

In some examples, the server chassis includes a third pair of connectors on the front side of the server chassis, to fluidly connect to a second cooling system of a second server node to be housed within the server chassis. The third pair of connectors are held to the server chassis with a second one or more movable attachments to support manual coupling and decoupling of the third pair of connectors to the cooling system. The third pair of connectors may be physically decoupled from the second pair of connectors such that decoupling of the third pair of connectors does not decouple the second pair of connectors, and decoupling of the second pair of connectors does not decouple the third pair of connectors.

In some examples, the plurality of fluid channels includes flexible hose that serves as the one or more movable attachments and holds the second pair of connectors to the server chassis. In some examples, the one or more movable attachments includes an elastic member that stretches to support manual coupling and decoupling of the second pair of connectors to the cooling system. In some examples, the one or more movable attachments includes a rotating member that rotates to support manual coupling and decoupling of the second pair of connectors to the cooling system.

In some examples, the first pair of connectors are blind mate connectors that mate blindly with the server rack connectors of the server rack in response to a force exerted on the server chassis to install the server chassis in the server rack.

The plurality of fluid channels may be located along a top portion of the server chassis. Additionally, or alternatively, the plurality of fluid channels may be located along a bottom portion of the server chassis. In some examples, the plurality of fluid channels may include a first fluid channel located along a top portion of the server chassis that fluidly connects a first of the first pair of connectors to a first of the second pair of connectors, and a second fluid channel located along a bottom portion of the server chassis that fluidly connects a second of the first pair of connectors to a second of the second pair of connectors.

Figure 1A:
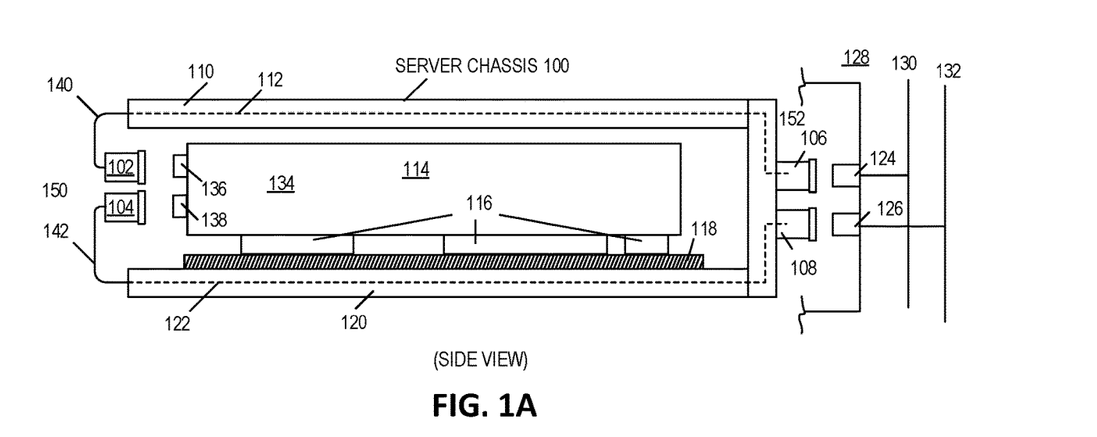
FIGS. 1A and 1B shows a server chassis with front-accessible fluid connection of a server node, according to some embodiments.
Figure 1B:
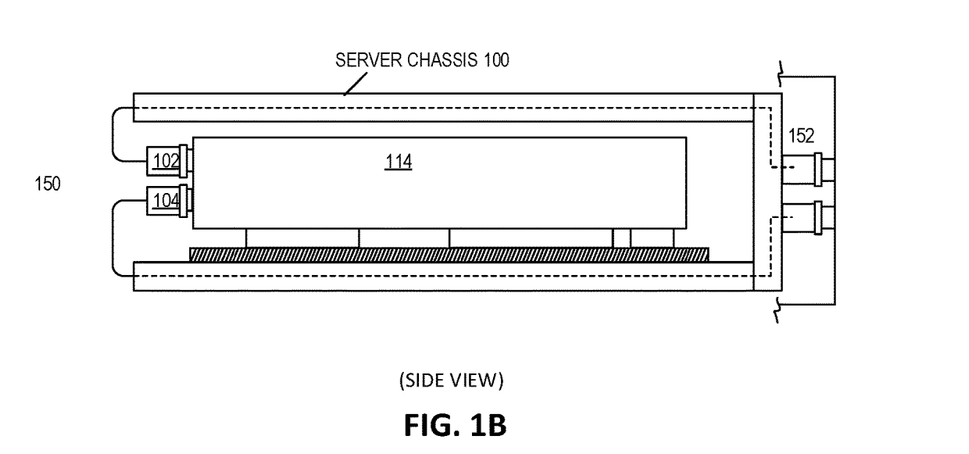

FIGS. 1A and 1B shows a server chassis 100 with front-accessible fluid connection of a server node, according to some embodiments. A server chassis 100 may be configured to populate a server rack 128. The server chassis 100 holds a server node 114 which may include dedicated electronics, cooling, and power, to support operation of one or more networked servers.

FIG. 1A shows the server chassis 100 being physically and fluidly detached from server rack 128. Further, the fluid connectors 102 and 104 from the server chassis 100 are fluidly detached from server node 114. FIG. 1B shows the server chassis 100 being populated to and fluidly connected to server rack 128. It can be shown that, with the architecture described herein, a user may attach the server chassis 100 to server rack 128 in a blind mating manner, and have front access to fluid connectivity of the server node.

The server chassis 100 includes a first pair of connectors 106, 108, on a rear side 152 of the server chassis 100. The first pair of connectors, which may be understood as main fluid connectors, are arranged to face in a rear direction to mate with server rack connectors 124, 126. The mating of the first pair of connectors to the server rack connectors fluidly connects the server rack to a supply line 130 and a return line 132 of the server rack. In an embodiment, the 130, 132, 124, 126 are combined as one unit as a rack level fluid distribution manifold.

Server chassis 100 includes a second pair of connectors 102 and 104 on a front side 150 of the server chassis, to fluidly connect to a cooling system 134 of a first server node 114 to be housed within the server chassis 100. The second pair of connectors are held to the server chassis with one or more movable attachments 140 and 142 to support manual coupling and decoupling of the second pair of connectors 102 and 104 to the cooling system 134. The movable attachments allow a user to move each connector 102 and 104 as needed to mate or detach those connectors with 136 and 138 without use of tools, and while the connectors remain attached to the server chassis 100.

Server chassis 100 includes a plurality of fluid channels 112 and 122 that fluidly connects a first of the first pair of connectors (e.g., 106) to a first of the second pair of connectors (e.g., 102), and a second of the first pair of connectors (e.g., 108) to a second of the second pair of connectors (e.g., 104).

In some examples, the plurality of fluid channels 112 and 122 may each include flexible hose that serves as the one or more movable attachments 140 and 142 and holds the second pair of connectors to the server chassis.

For example, at least part of the fluid channel 112 may include flexible hose along the top portion 110 of the server chassis 100. At the front portion 150 of the server chassis, the flexible hose 140 may float so that connector 102, which is attached to the end of the flexible hose, may be freely moved, with some natural resistance from the flexible hose. A user may access this connector 102 from the front of the server rack 128, to fluidly connect or disconnect the server node 114 from server rack fluid line 130.

Similarly, at least part of the fluid channel 122 may include flexible hose along the bottom portion 120 of the server chassis 100. At the front of the server chassis, the flexible hose 142 may float so that connector 104, which is attached to the end of the flexible hose 142, may be freely moved, with some natural resistance from the flexible hose. A user may access this connector 104 from the front of the server rack 128, to fluidly connect or disconnect a server node 114 from server rack fluid line 132.

In some examples, movable attachments 140 and 142 may include additional components such as, for example, a rotating member, an elastic member, a telescoping member, or a combination thereof. In each such example, the connectors 102 and 104 may be fluidly connected to flexible hoses, to allow for movement of the connectors while remaining physically and fluidly attached to the server chassis 100. Examples are further described in other sections.

In some examples, cooling system 134 includes a cold plate. The cooling system may be thermally coupled to one or more electronic server components 116 such as, for example, an integrated circuit (IC) which can be a surface mounted device (SMD) that is fixed to a printed circuit board (PCB) 118. The cold plate may include internal channels that circulate the fluid. The fluid may absorb thermal energy when in the cold plate, thus transferring thermal energy away from the server components 116.

In other examples, the cooling system may include a thermosiphon chamber that utilizes the thermosiphon process to absorb thermal energy. In such a case, the fluid into and out of the cooling system 134 may condense a two-phase fluid within the thermosiphon chamber. In such a case, the two-phase fluid is fluidly isolated from the fluid from the server chassis.

In other examples, the fluid throughout the server rack 128, server chassis 100, and server node 114 may be a two-phase fluid. In such a case, connector 102 may receive vaporized fluid or mixed fluid from cooling system 134 and connector 104 may deliver liquid fluid to cooling system 134. The one or more electronic server components 116, the cooling system 134, and PCB 118 may be grouped and assembled as a server node 114 to provide functionality, for example, of a network connected server.

Connectors 106 and 108 can be understood as main fluid connectors of the server chassis 100, to fluidly connect to supply line 130 and return line 132 of the server rack 128. The supply line connector 130 and return line connector 132 can be fluid ports on a supply manifold and a return manifold of server rack 128. Although shown with the supply line 130 connecting to fluid channel 112 located at a top region of the server chassis, and return line 132 connecting to fluid channel 122 located at the bottom region of the server chassis, this arrangement may be reversed. For example, the supply line may deliver fluid to the server node along fluid channels 122 on the bottom portion 120 of the server chassis, and the return line may receive fluid from the server node 114 through fluid channels 112 that run along the top portion 110 of the server chassis. Such a configuration may be favorable in the case of a two-phase cooling fluid.

In some examples, fluid channels 112, 122 may include rigid or flexible conduit, channels within a solid plate, or a combination thereof. The plurality of fluid channels 112, 122 may, in some cases, be located only along a top portion of the server chassis. In other examples, the plurality of fluid channels 112, 122 may be located only along a bottom portion of the server chassis.

In some examples, as shown in FIGS. 1A and 1B, the plurality of fluid channels includes a first fluid channel 112 located along a top portion 110 of the server chassis that fluidly connects a first 106 of the first pair of connectors to a first 102 of the second pair of connectors, and a second fluid channel 122 located along a bottom portion 120 of the server chassis that fluidly connects a second 108 of the first pair of connectors to a second 104 of the second pair of connectors. The top portion 110 may include a ceiling wall that runs above the server node 114. The bottom portion 120 may include a floor that runs below the server node 114. Fluid channels 112, 122 may be fixed along or within the floor and the ceiling wall, using straps, brackets, zip ties, or other fastening hardware. In some cases, as described, the fluid channels may be at least partially machined as channel within the top or bottom portion.

The first pair of connectors 106 and 108 may be blind mate connectors that mate blindly with the server rack connectors 124 and 126 of the server rack in response to a force exerted on the server chassis, to install the server chassis in the server rack. For example, a user may push server chassis 100 into a dedicated position within server rack 128 to fluidly connect the server chassis main connectors 106, 108 to the server chassis fluid lines 130 and 132. No further manual operation need be performed (e.g., turning of the connectors).

In some examples, the front connectors 102, 104 may also be blind mate connectors or semi-blind mate connectors. Blind mate connectors can include spring-loaded connection mechanisms that allow for automatic mating based on applied force. Further, each of the connectors described in the present disclosure may be dripless connectors that automatically close when disconnected. Dripless connectors can include spring-loaded valves that automatically cut off fluid flow when disconnected.

The server chassis architecture provides front access and rear access. The front access is designed for maintenance, servicing, installation, or removal of server nodes from the server chassis. The rear access is designed for the cooling hardware. Some of fluid lines 112 and 120 may continue at the rear portion 152 of the server chassis, to complete the fluid path from the server node 114 to the server rack 128. In some examples, as shown in FIGS. 1A and 1B, the top portion 110 and bottom portion 120 may be mechanically joined to a rear side of the server chassis, and that rear wall may hold connectors 106 and 108.

Figure 2:
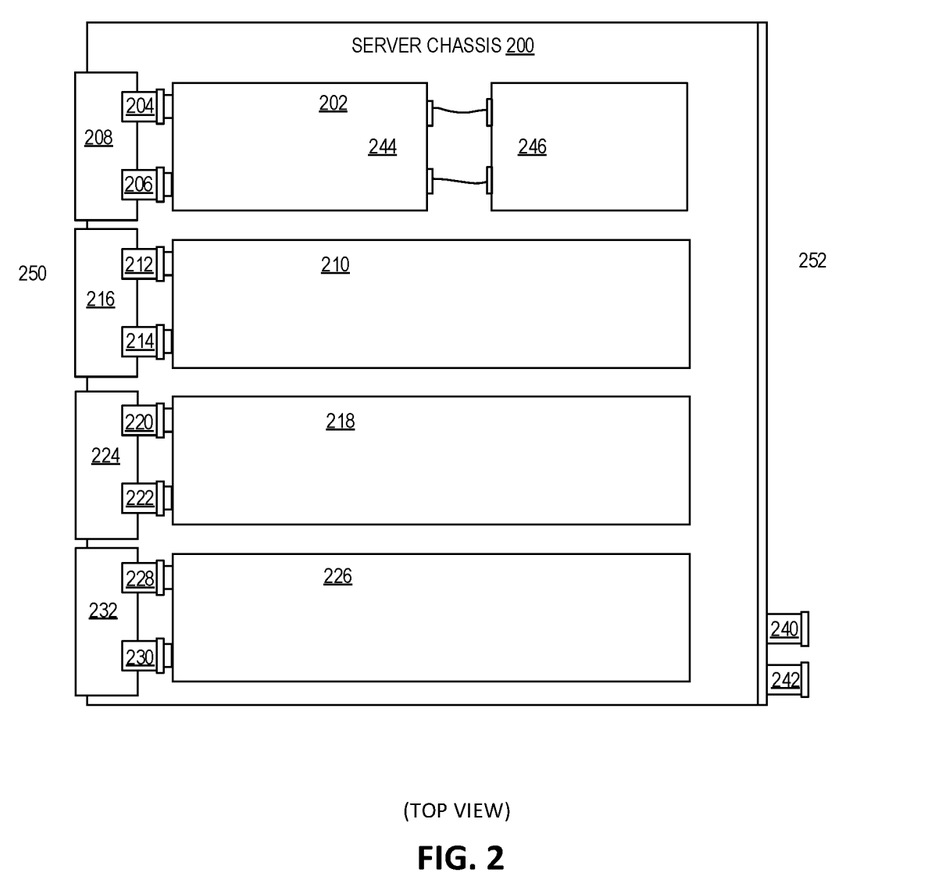
FIG. 2 shows a server chassis with a plurality of server nodes, according to some embodiments.

FIG. 2 shows a server chassis 200 with a plurality of server nodes, according to some embodiments. A top view of server chassis 200 is shown. Server chassis 200 may share common features with the server chassis embodiments described in other sections.

A server chassis may house a plurality of server nodes, such as server nodes 202, 210, 218, and 226. Each server node may include respective components such as one or more cooling systems, electronics, PCBs, and other components.

The server chassis 200 may include a respective movable attachment 208, 216, 224, and 232 for each pair of connectors on that server chassis that is to connect to a respective server node. The movable attachments may each operate independent and freely, such that decoupling of one pair of connectors from one of the server nodes does not decouple a second pair of connectors from a second server node, and vice versa.

For example, a user may fluidly disconnect server node 210 from server chassis 200 by disconnecting connectors 212 and 214 from connectors of a cooling system of server node 210. Connectors 212 and 214 are attached to movable attachment 216, which is attached to the server chassis 200, but physically decoupled from movable attachment 224. As such, connectors 220 and 222 may remain attached to the cooling plate of server node 218. Moveable attachments 208, 216, 224, and 232 may include flexible hoses or additional hardware, as described in other sections.

Similarly, a user may fluidly connect or disconnect server node 218 from server chassis 200 by disconnecting connectors 220 and 222 from connectors of a cooling system of server node 218. Connectors 220 and 222 are attached to movable attachment 224, which is physically connected to the server chassis 200 and decoupled from movable attachment 232. As such, connectors 228 and 230 may remain attached or detached to the cooling plate of server node 226.

With such an architecture, a user may service server nodes of a server chassis independently and in a manner that does not fluidly disturb other server nodes in that server chassis. Server nodes may be serviced or replaced on a node-by-node basis. Although not shown here, fluid channels may run from a main connector 240 to a first of each pair of connectors such as connectors 204, 212, 220, and 228. Fluid channels may run from a second main connector 242 to a second of each pair of connectors 206, 214, 222, and 230. The main connectors 240 and 242 may connect to a fluid supply line and fluid return line of a server rack, as described in other sections. The fluid channels may run along a bottom portion of the server chassis (e.g., below the server nodes), or they may run along a top portion of the server chassis (e.g., above the server nodes), or both.

The server chassis 200 may include a frame, brackets, mounting hardware, a rale, plates, and other mechanical members that support attachment of the server nodes to the server in a structurally manner.

A server node may include a plurality of electronic server components that work together to serve as an integrated server solution, which may be connected to a computer network to provide one or more services to clients over the computer network. Each server node can perform dedicated operations independent of other server nodes. A single server chassis may house server nodes with varying cooling system arrangements, thus providing a flexible and high-density computing platform. For example, server node 202 may include a plurality of cooling systems 244 and 246 such as cold plates that may be fluidly connected in parallel or in series or a combination thereof. Cooling systems 244 and 246 shows that each individual cooling module can be designed with different arrangements such as including 244 and 246, which may be preassembled together before being populated to the server chassis.

Figure 3A:
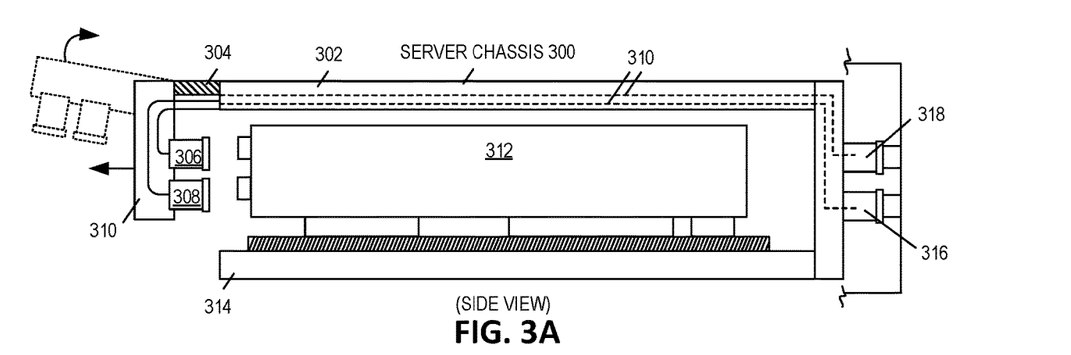
FIGS. 3A and 3B shows an example of a server chassis with an elastic component 304, in accordance with some embodiments.
Figure 3B:
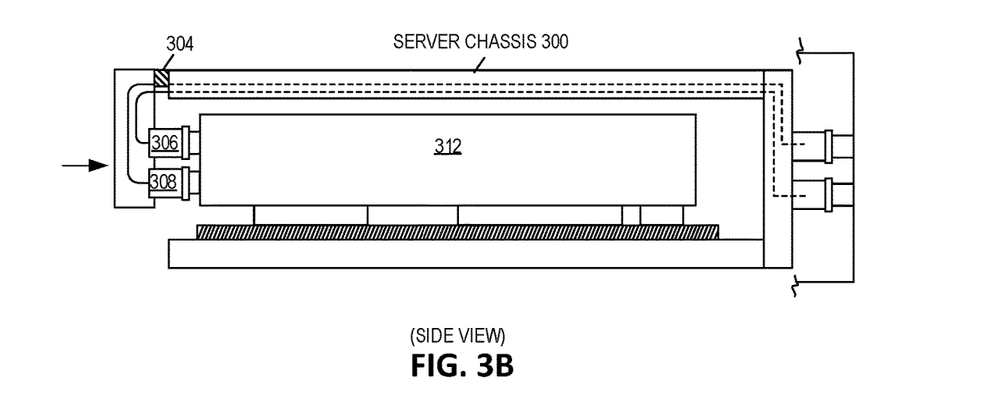

FIG. 3A and FIG. 3B shows an example of a server chassis 300 with an elastic component 304, in accordance with some embodiments. Server chassis 300 may include a pair of main connectors 318 and 316 on a rear side of the server chassis arranged to face in a rear direction to mate with server rack connectors, to fluidly connect the server chassis to a supply line and a return line of the server rack. The server chassis includes a second pair of connectors 306 and 308 on a front side of the server chassis, to fluidly connect to a cooling system of a server node 312 to be housed within the server chassis 300. The second pair of connectors 306 and 308 are held to the server chassis with one or more movable attachments 304 to support manual coupling and decoupling of the second pair of connectors to the cooling system. Server chassis 300 includes a plurality of fluid channels 310 that fluidly connects the pair of connectors 306, 308, to the main connectors 316 and 318, respectively.

In this example, server chassis 300 includes fluid channels 310 that are located in the top portion 302 but not the bottom portion 314 of the server chassis. The one or more movable attachment 304 may be one or more elastic members, which may include a rubber section, a plastic section, silicone section, a section formed from a spring, a curved sheet metal or wire (e.g., U-shaped or S-shaped), or a combination of such sections. The one or more elastic members 304 may join directly to connectors 306 and 308, or alternatively, to a connector bracket 310 that holds connectors 306 and 308. The connector bracket 310 may include a plate or arm that is stiff.

The elastic member 304 may deform, compress, decompress, and/or stretch to support manual coupling and decoupling of the second pair of connectors to the cooling system. The elastic member 304 may have a bending and stretching material that permits movement of the connectors 306 and 308 such that a user may manually disconnect the connectors 306 and 308 from the server node (e.g., with a pulling force), while the connectors 306 and 308 remain physically attached to the server chassis 300, as shown in FIG. 3A. The elastic member may bend or flex such that the connector bracket 310 is rotated away from the server node 312, thus allowing for maintenance, removal, or installation of a server node with respect to server chassis 300. Elasticity may be understood as the ability of a deformed material body to return to its original shape and size when a force that causes the deformation is removed. A body with this ability may be understood as an elastic component.

A user may push the connectors 306, 308 to engage and mate the connectors 306 and 308 with the cooling system, as shown in FIG. 3B. The elastic member 304 and connector bracket 310 promotes proper mating and mating pressure of connectors 306, 308 to the cooling system of server node 312.

In some aspects, the elastic member 304 may include a plurality of elastic members. For example, each connector 306 and 308 may be independently attached to separate elastic members through respective connector brackets. The separate elastic members may be independently connected to top portion 302. These elastic members may attach to the top portion 302, to the bottom portion 314, or both the top and bottom portion. Similarly, the fluid channels may along the bottom portion of the server chassis, the top portion of the server chassis, or both.

In figures of the present disclosure, some components such as the server chassis and server nodes have been omitted for simplicity. Further, it should be understood that the server chassis, and server frame as described in the present disclosure are simplified in many respects and hardware can vary without departing from the scope of the present disclosure.

A server chassis and server rack may include one or more members such as plates, sheet metal, bars, brackets, pads, and other mechanical members that may be joined to form a rigid structure onto which electronic components of a server and other supporting components can be mounted upon. Other supporting components can include electrical connectors, electrical harnesses, fluid connectors, fluid lines, power supplies, fans, cold plates, and other supporting components. The server rack, server chassis, or both may include rales or other sliding hardware to guide positioning and mating of a server chassis into a dedicated position of the server rack.

Figure 4:
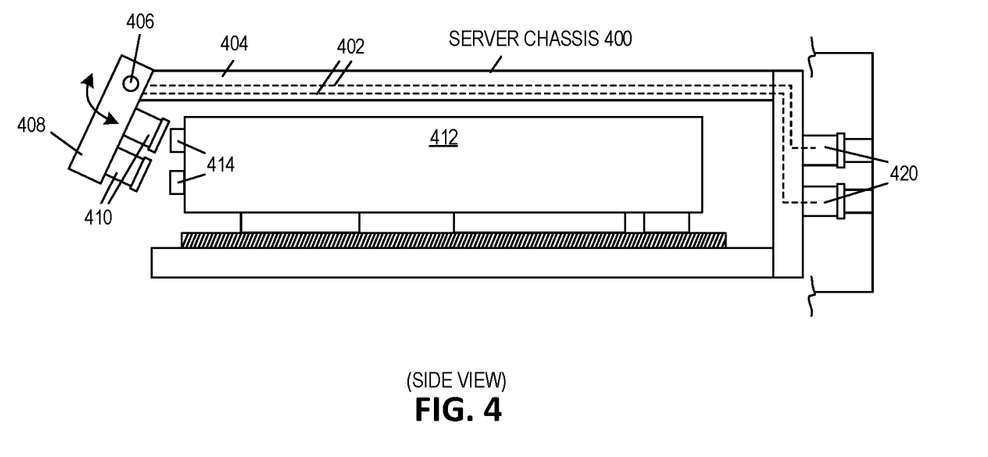
FIG. 4 shows a server chassis with a rotating fluid connector, according to some embodiments.

FIG. 4 shows a server chassis with a rotating fluid connector, according to some embodiments. Server chassis 400 may include features described in other sections. For example, server chassis 400 includes rear-facing main connectors 420 that mate with fluid lines of a server rack and a plurality of fluid channels 402 that fluidly connects the main connectors to a second pair of connectors 410 which are located and accessible at a front of the server chassis. These connectors 410 are to mate with and fluidly connect with a cooling system of server node 412. It should be understood that fluid channels 402, movable member 408, connectors 410 and 420, and the rest of the server chassis components are physically assembled to server chassis 400 such that they remain fixed to the server chassis regardless of if the server chassis is installed upon or removed from the server rack. Thus, the server chassis may be understood as an assembly of the described components.

In this example, the second pair of connectors 410 are attached to the one or more movable attachments which includes a rotating member 408 that rotates to support manual coupling and decoupling of the second pair of connectors 410 to the cooling system of server node 412. The rotating member 408 may include a connector bracket (e.g., a plate, an arm, and/or other structure) upon which the connectors 410 are fixed. The rotating member 408 may rotate about a joint 406, which may include a shaft, a socket, an axle, a ball bearing, a wheel, a gear, or other rotating hardware. In some embodiments, the connectors 414 of the server node 412 may be arranged at an angle that promotes mating between the second pair of connectors 410 and the server node connectors 414. In some embodiments, rotating member 408 may include a plurality of arms that rotate about two or more joints, to provide additional freedom of movement to the connectors 410. An additional arm and pivot may allow the connectors to back away straighter from the server node 412.

Flexible hoses may connect the connectors 410 to fluid channels 402 in this example with rotating member 408, and other embodiments such as with an elastic member. In some embodiments, rotating member 408 may be arranged at bottom portion or at both the top and bottom portion of server chassis 400.

Figure 5:
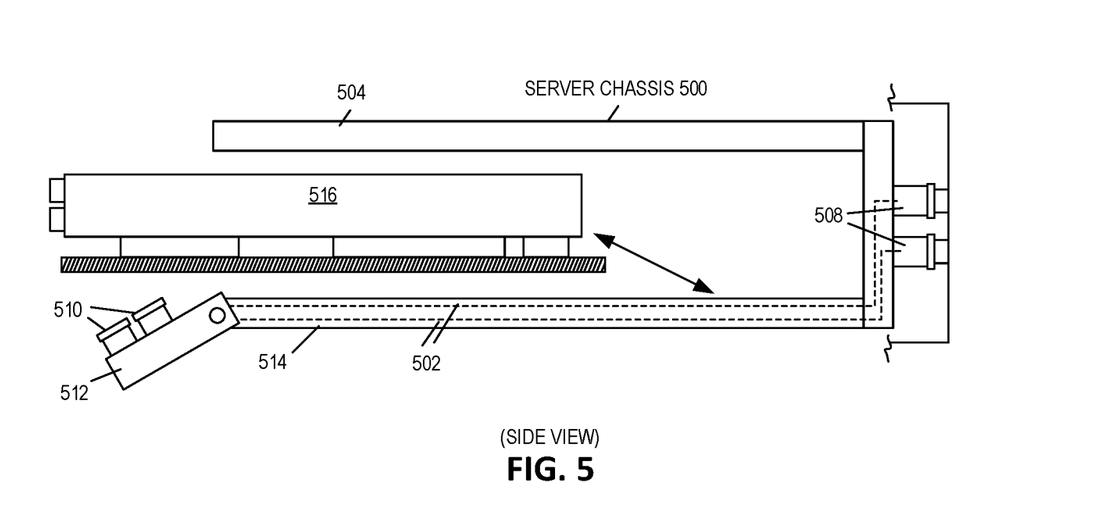
FIG. 5 shows a server chassis with fluid lines running along a bottom side of the server chassis, according to some embodiments.

FIG. 5 shows a server chassis 500 with fluid lines running along a bottom side of the server chassis, according to some embodiments.

Fluid channels 502 may be positioned to run along a bottom portion 514 of server chassis 500. Server node 516 may lay on the bottom portion 514 of the server chassis 500, above the fluid channels 502. The main connectors 508 of the server chassis 500 may fluidly connect to a second pair of connectors 510 through fluid channels 502. The second pair of connectors 510 are positioned to be couple or decouple with connectors of a server node 516. The second pair of connectors 510 may be attached to a movable member 512 which may be a rotating member as shown, or an elastic member, as described in other sections, or floating connectors, held solely by flexible conduit.

The second pair of connectors 510 may be moved so that server node 516 may be accessed, serviced, installed upon, or removed from server chassis 500 from the front of the server chassis. Further, as described, server chassis 500 may include a plurality of server nodes that fluidly connect to fluid channels 502 in an independent manner. Although not shown, server chassis 500 may include a plurality of connectors such as the second pair of connectors 510, to mate with a respective one of a plurality of server nodes. The plurality of server nodes may include be dripless, such that server nodes of a given server chassis may be independently serviced without interrupting fluid connectivity for other server nodes within the same server chassis. The bottom fluid loop design may provide additional possibilities to improve the server reliability in some cases.

Figure 6:
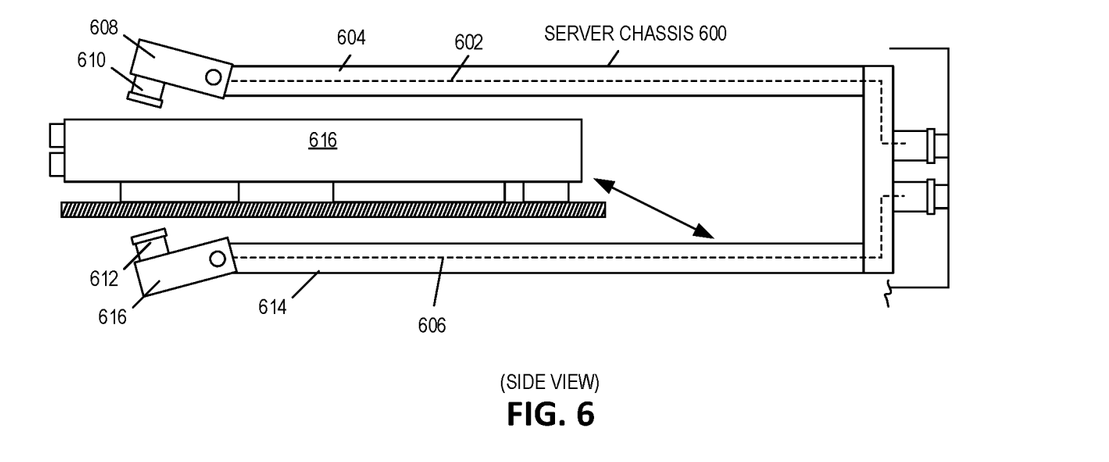
FIG. 6 shows an example of a server chassis with rotating fluid connectors, in accordance with some embodiments.

FIG. 6 shows an example of a server chassis 600 with rotating fluid connectors, in accordance with some embodiments. Server chassis 600 may have one or more fluid channels 602 fixed at or in a top portion 604 and one or more fluid channels 606 fixed at or in a bottom portion 614 of the server chassis. One of 602 and 604 may be dedicated to fluid supply lines, and the other may be dedicated for fluid return lines.

Such an architecture may promote efficient implementation of some cooling technology such as, for example, thermosiphon loops, two phase recirculation loop, and so on. In addition, such a configuration may improve the overall fluid loop reliability by allowing for more efficient leak detection and leak prevention.

As shown, connector 610 may be fixed to movable member 608. Similarly, connector 612 may be fixed to movable member 616. The connectors and movable members may be manually moved to create an opening at the front of the server chassis 600. The opening may allow a user to service, maintain, install, or remove a server node through the front of the server chassis. Further, cooling hardware may be arranged at and serviced from a rear area of the server rack.

In this example, movable member 616 and 608 may include rotating members that rotate about a joint. In other examples, each of the movable members 608 and 616 may include an elastic component, as described. Additionally, or alternatively, the fluid lines 602, 606, and movable members 608 and 616 may include flexible conduit which may serve to carry the fluid and to hold the connectors 610 and 612 in a movable manner.

Figure 7:
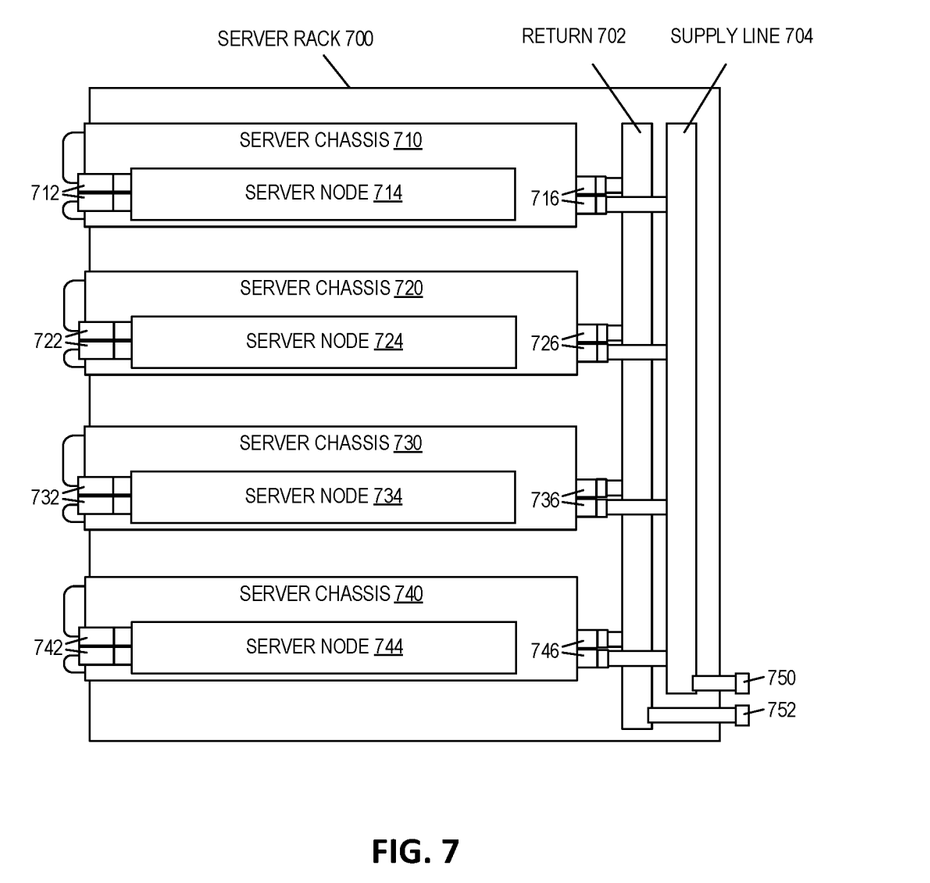
FIG. 7 shows an example of a server rack with a plurality of server chassis, in accordance with some embodiments.

FIG. 7 shows an example of a server rack 700 with a plurality of server chassis, in accordance with some embodiments. A server rack 700 may include a plurality of server chassis such as server chassis 710, 720, 730, and 740. Each of the server chassis may include one or more server nodes, such as server nodes 714, 720, 730, and 740.

As discussed, a server chassis may have two or more server nodes. In the same server rack, some server chassis may include a plurality of server nodes while others may include only a single server node. Each server node may include one or more cooling systems that receive and return fluid from the server chassis in which it is housed.

The server chassis architecture described in the present disclosure provides an efficient and flexible architecture at the server chassis level, to fluidly connect each server node to the server rack. The fluid distribution within the server chassis may vary between server chassis to accommodate different arrangements and density requirements of server nodes.

Each of the server chassis can have a first pair of connectors such as connectors 716, 726, 736, and 746 on a rear side of the respective server chassis. The first pair of connectors may be fixed on a rear wall of the server chassis to face in a rear direction to mate with server rack connectors which fluidly connect the server chassis to a supply line 704 and a return line 702 of the server rack.

Each of the plurality of server chassis 710, 720, 730 and 740 may have front accessible fluid connections to server nodes. For example, each server chassis may include a second pair of connectors such as 712, 722, 732, and 742. The second pair of connectors may be fixed to a front region of the respective server chassis, to fluidly connect to a cooling system of a respective server node (714, 724, 734, and 744, respectively).

The second pair of connectors are held to the server chassis with one or more movable attachments to support manual coupling and decoupling of the second pair of connectors to the cooling system. The movable attachments may include flexible hose, a rotating member, an elastic member, or a combination thereof.

Further, each server chassis may include a plurality of fluid channels which are not shown, that fluidly connects a first of the first pair of connectors 716, 726, 736, and 746, to a first of the second pair of connectors 712, 722, 732, and 742, and a second of the first pair of connectors 716, 726, 736, and 746 to a second of the second pair of connectors 712, 722, 732, and 742. As described, these fluid channels may run along a top portion of the server chassis, a bottom portion of the server chassis, or a combination thereof.

The fluid supply line 704 serves as a centralized fluid distribution point within the server rack to circulate fluid to each of the server chassis. Similarly, the fluid return line 702 serves as a centralized fluid collection point within the server rack to collect fluid from each of the server chassis. The fluid supply line and fluid return line may be understood as manifolds. Manifolds can reduce the number of fluid lines and connectors within a system by using a common structure such as a fluid hub with ports on it, for distribution or collection of fluid. The return 702 and the supply line 704 may include connectors that mate with the main connectors each server chassis. For example, return 702 and supply line 704 may have a first pair of connectors that mate with the main connectors 716 of server chassis 710; a second pair of connectors that mate with main connectors 726 of server chassis 720; a third pair of connectors 736 that mate with server chassis 730; and a fourth pair of connectors that mate with main connectors 746 of server chassis 740. The supply line 704 and return line 702 may each have respective connectors 750 and 752 to interface with an external fluid supply system.

Although not shown, the server rack can fluidly connect to an external fluid supply source that can include a pump, a fluid cooler, and/or other fluid components. Similarly, some components such as, for example, those of the connector assembly, are omitted here for illustration purposes. In some embodiments, the fluid that is circulated within the server rack, server chassis, and server node includes a single-phase fluid such as a liquid coolant.

In other embodiments, the fluid may include a two-phase fluid. In such a case, the supply line may carry fluid in liquid form and the return line may carry fluid in vapor form. In particular, the fluid input to each server node may be liquid or primarily liquid, and the output of each server node may be vapor or a mixture of vapor and liquid.

Furthermore, although not shown, a server rack can, in some embodiments, include various other supporting components. For example, a server rack can include a cooling distribution unit (CDU), a rack management unit (RMU). The server chassis can also be referred to as a server blade that can be inserted into an array of server slots respectively from frontend or backend of the server rack. A server rack can be either open to the environment or partially contained by a rack container. The server rack can include one or more cooling fans that can generate airflow from a frontend to a backend of the server rack. In some embodiments, a server rack may include a cooling fan for each server chassis. The cooling fans may be mounted on each server chassis to generate airflow through the server chassis. In some embodiments, the CDU can include a heat exchanger, liquid pump, a pump controller, a fluid reservoir, a power supply, sensors and more. The CDU's heat exchanger may be a liquid-to-liquid heat exchanger that includes a first loop with inlet and outlet ports having a first pair of liquid connectors coupled to external liquid supply/return lines to form a primary loop. The liquid supply/return lines may be fluidly connected to a set of room manifolds, which may be coupled to an external heat removal system, or external cooling loop. In addition, the heat exchanger may further include a second loop with two ports having a second pair of liquid connectors coupled to the fluid manifold to form a secondary loop that fluidly supplies and returns fluid between one or more server chassis and the CDU.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

A server rack may further include an optional RMU configured to provide and manage power supplied to servers, fan modules, and the CDU. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of the server rack.

Aspects of the cooling distribution system can be flexible and deployable in different system architectures; for example, the system can be deployed with a localized pumping system (e.g., a closed system architecture) or central pumping system (e.g., an open system architecture). Aspects described can simultaneously separate IT equipment from leaked fluid and direct leaked fluid to pool in a common location for detection, thereby minimizing the impact of a fluid leak and increasing overall system reliability.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A server chassis, comprising:
   a first server node;
   a first pair of connectors on a rear side of the server chassis arranged to face in a rear direction to mate with server rack connectors of a server rack which fluidly connect the server chassis to a supply line and a return line of the server rack;
   a second pair of connectors on a front side of the server chassis, to fluidly connect to a cooling system of the first server node to be housed within the server chassis, wherein the second pair of connectors are held to the server chassis with one or more movable attachments to support coupling and decoupling of the second pair of connectors to the cooling system; and
   a plurality of fluid channels that fluidly connects a first of the first pair of connectors to a first of the second pair of connectors, and a second of the first pair of connectors to a second of the second pair of connectors.

2. The server chassis of claim 1, further comprising a third pair of connectors on the front side of the server chassis, to fluidly connect to a second cooling system of a second server node to be housed within the server chassis, wherein the third pair of connectors are held to the server chassis with a second one or more movable attachments to support coupling and decoupling of the third pair of connectors to the cooling system.

3. The server chassis of claim 2, wherein the third pair of connectors are physically decoupled from the second pair of connectors such that decoupling of the third pair of connectors does not decouple the second pair of connectors, and decoupling of the second pair of connectors does not decouple the third pair of connectors.

4. The server chassis of claim 1, wherein the plurality of fluid channels include flexible hose that serves as the one or more movable attachments and holds the second pair of connectors to the server chassis.

5. The server chassis of claim 1, wherein the one or more movable attachments includes an elastic member that stretches to support coupling and decoupling of the second pair of connectors to the cooling system.

6. The server chassis of claim 1, wherein the one or more movable attachments includes a rotating member that rotates to support coupling and decoupling of the second pair of connectors to the cooling system.

7. The server chassis of claim 1, wherein the first pair of connectors are blind mate connectors that mate blindly with the server rack connectors of the server rack in response to a force exerted on the server chassis to install the server chassis in the server rack.

8. The server chassis of claim 1, wherein the plurality of fluid channels are located along a top portion of the server chassis.

9. The server chassis of claim 1, wherein the plurality of fluid channels are located along a bottom portion of the server chassis.

10. The server chassis of claim 1, wherein the plurality of fluid channels includes a first fluid channel located along a top portion of the server chassis that fluidly connects a first of the first pair of connectors to a first of the second pair of connectors, and a second fluid channel located along a bottom portion of the server chassis that fluidly connects a second of the first pair of connectors to a second of the second pair of connectors.

11. A server rack, comprising:
    a fluid manifold having a supply line and a return line; and
    a plurality of server chassis, at least one of the plurality of server chassis including:
    a first pair of connectors on a rear side of the server chassis arranged to face in a rear direction to mate with server rack connectors of the server rack which fluidly connect the server chassis to the supply line and the return line of the server rack;
    a second pair of connectors on a front side of the server chassis, to fluidly connect to a cooling system of a first server node to be housed within the server chassis, wherein the second pair of connectors are held to the server chassis with one or more movable attachments to support coupling and decoupling of the second pair of connectors to the cooling system; and
    a plurality of fluid channels that fluidly connects a first of the first pair of connectors to a first of the second pair of connectors, and a second of the first pair of connectors to a second of the second pair of connectors.

12. The server rack of claim 11, wherein each of the plurality of server chassis further comprises a third pair of connectors on the front side of the server chassis, to fluidly connect to a second cooling system of a second server node to be housed within the server chassis, wherein the third pair of connectors are held to the server chassis with a second one or more movable attachments to support coupling and decoupling of the third pair of connectors to the cooling system.

13. The server rack of claim 12, wherein the third pair of connectors are physically decoupled from the second pair of connectors such that decoupling of the third pair of connectors does not decouple the second pair of connectors, and decoupling of the second pair of connectors does not decouple the third pair of connectors.

14. The server rack of claim 11, wherein the plurality of fluid channels includes flexible hose that serves as the one or more movable attachments and holds the second pair of connectors to the server chassis.

15. The server rack of claim 11, wherein the one or more movable attachments includes an elastic member that stretches to support coupling and decoupling of the second pair of connectors to the cooling system.

16. A cooling apparatus, comprising:
- a first pair of connectors on a rear side of a server chassis arranged to face in a rear direction to mate with server rack connectors of a server rack which fluidly connect the server chassis to a supply line and a return line of the server rack;
- a second pair of connectors on a front side of the server chassis, to fluidly connect to a cooling system of a first server node to be housed within the server chassis, wherein the second pair of connectors are held to the server chassis with one or more movable attachments to support coupling and decoupling of the second pair of connectors to the cooling system; and
- a plurality of fluid channels that fluidly connects a first of the first pair of connectors to a first of the second pair of connectors, and a second of the first pair of connectors to a second of the second pair of connectors.

17. The cooling apparatus of claim 16, further comprising a third pair of connectors on the front side of the server chassis, to fluidly connect to a second cooling system of a second server node to be housed within the server chassis, wherein the third pair of connectors are held to the server chassis with a second one or more movable attachments to support coupling and decoupling of the third pair of connectors to the cooling system.

18. The cooling apparatus of claim 17, wherein the third pair of connectors are physically decoupled from the second pair of connectors such that decoupling of the third pair of connectors does not decouple the second pair of connectors, and decoupling of the second pair of connectors does not decouple the third pair of connectors.

19. The cooling apparatus of claim 16, wherein the plurality of fluid channels includes flexible hose that serves as the one or more movable attachments and holds the second pair of connectors to the server chassis.

20. The cooling apparatus of claim 16, wherein the one or more movable attachments includes an elastic member that stretches to support coupling and decoupling of the second pair of connectors to the cooling system.

* * * * *